United States Patent
Takahashi et al.

(10) Patent No.: US 6,778,451 B2
(45) Date of Patent: Aug. 17, 2004

(54) SEMICONDUCTOR MEMORY DEVICE FOR MASKING ALL BITS IN A TEST WRITE OPERATION

(75) Inventors: Yoshitaka Takahashi, Kawasaki (JP); Hitoshi Ikeda, Kawasaki (JP); Shinya Fujioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 37 days.

(21) Appl. No.: 10/171,686

(22) Filed: Jun. 17, 2002

(65) Prior Publication Data

US 2002/0149971 A1 Oct. 17, 2002

Related U.S. Application Data

(62) Division of application No. 09/790,612, filed on Feb. 23, 2001, now Pat. No. 6,498,755.

(30) Foreign Application Priority Data

Feb. 24, 2000 (JP) ........................................ 2000-047804

(51) Int. Cl.$^7$ .............................................. G11C 29/00
(52) U.S. Cl. ........................ 365/201; 712/720; 714/718
(58) Field of Search ........................ 365/201; 712/720, 712/224; 714/718, 720

(56) References Cited

U.S. PATENT DOCUMENTS

| | | | | |
|---|---|---|---|---|
| 3,921,144 A | * | 11/1975 | Woodrum | 711/201 |
| 4,958,346 A | * | 9/1990 | Fujisaki | 714/720 |
| 5,757,704 A | | 5/1998 | Hachiya | 365/189.07 |
| 5,933,385 A | | 8/1999 | Jiang et al. | 365/230.01 |
| 5,935,239 A | * | 8/1999 | Narayan | 712/224 |
| 6,181,634 B1 | | 1/2001 | Okita | 365/230.05 |
| 6,484,255 B1 | * | 11/2002 | Dulong | 712/224 |

* cited by examiner

*Primary Examiner*—Hoai Ho
(74) *Attorney, Agent, or Firm*—Arent Fox PLLC

(57) ABSTRACT

A semiconductor storage device conducts a late-write operation. The semiconductor storage device comprises: a memory core circuit storing data; a data latch circuit storing preceding data corresponding to a preceding write-operation; an address compare circuit comparing a preceding address corresponding to the preceding write-operation and a present address corresponding to a present read-operation so as to determine whether the preceding address and the present address match each other; and a control circuit. The control circuit controls a test read-operation to read data from the memory core circuit regardless of whether the preceding address and the present address match each other.

7 Claims, 4 Drawing Sheets

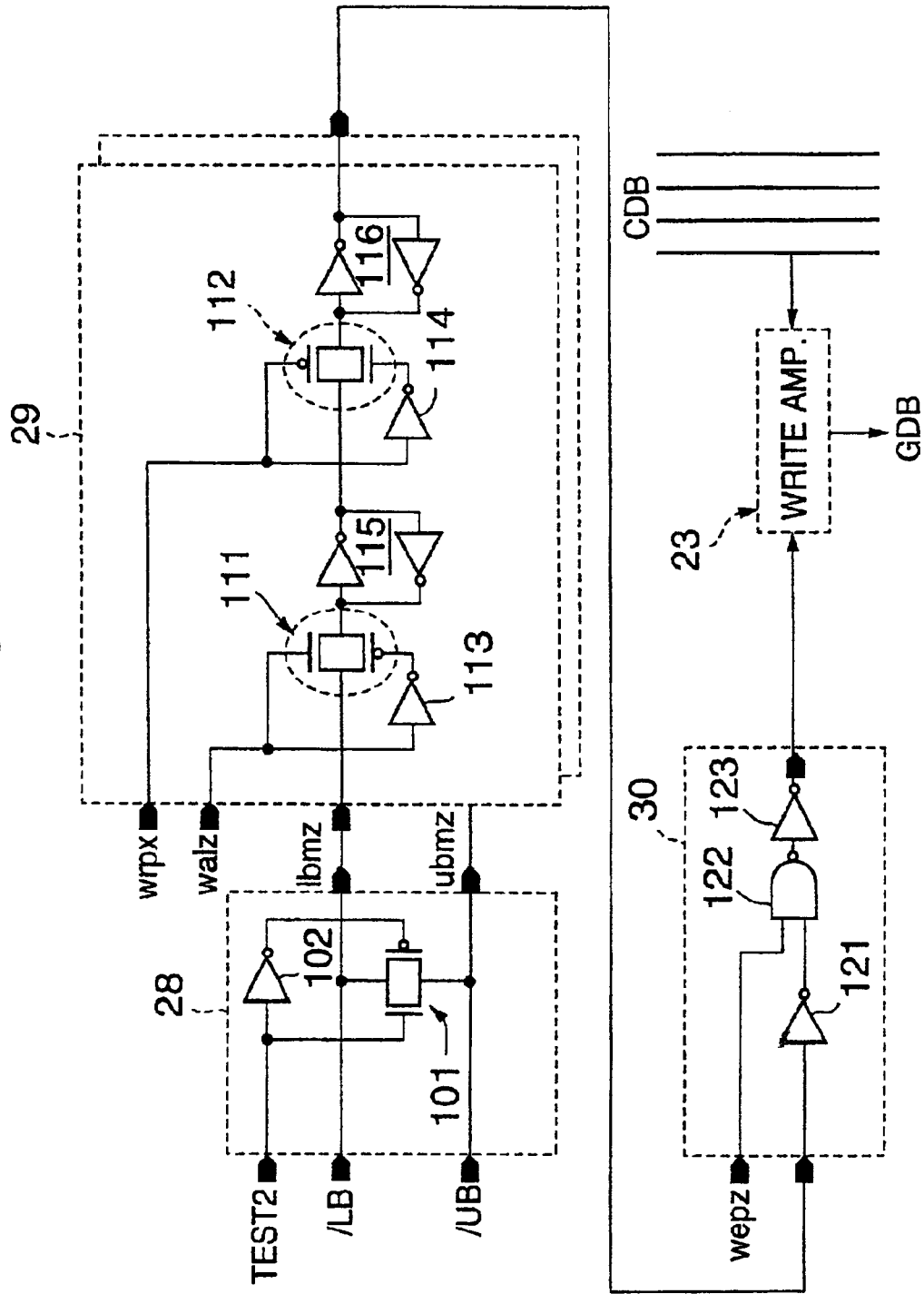

SEMICONDUCTOR MEMORY DEVICE FOR MASKING ALL BITS IN A TEST WRITE OPERATION

This is a Division of application Ser. No. 09/790,612 filed Feb. 23, 2001, now U.S. Pat. No. 6,498,755. The disclosure of the prior application(s) is hereby incorporated by reference herein in its entirety.

BACKGROUND OF THE INVENTION

1. Field of the Invention

The present invention generally relates to a semiconductor storage device and, more particularly, to a semiconductor storage device which conducts a late-write operation.

2. Description of the Related Art

Some semiconductor storage devices conduct a late-write operation so as to provide a timing margin in writing data. In the late-write operation, when a command to write particular data is input, the data is not immediately written to a memory cell in a core circuit, but is retained in an internal buffer. Thereafter, when a command to write following data is input, the first data is written to the memory cell in the core circuit for the first time. The above-mentioned following data is stored in the internal buffer, and is retained therein until a further next write-command is input.

Since there are plenty of steps between inputting data and writing the data to the core circuit, it takes a long time to finish writing the data to the core circuit in one operation. The semiconductor storage device conducting the late-write operation writes the data only in the internal buffer in a first operation. Therefore, it only takes a short time to finish the data writing in one operation, providing a sufficient timing margin in the data writing.

The semiconductor storage device conducting the late-write operation requires a contrivance when reading data written last. That is, since data written last is stored in the internal buffer, the data needs to be written out, not from an address in the core circuit corresponding to this data, but from the internal buffer in which the data is stored.

To realize this contrivance, the semiconductor storage device conducting the late-write operation needs to compare a present read address with a write address input last. Thereby, when the present read address and the write address input last match each other, the data is written out, not from the core circuit, but from the internal buffer. This enables reading data written by a preceding write operation.

However, in a test operation, the semiconductor storage device having the above-described structure conducting the late-write operation may result in writing data to or reading data from the internal buffer instead of writing, data to or reading data from a memory cell aimed in the test. In this case, it is impossible to confirm operations of the memory cell, let alone to reject the memory cell if it is an inferior cell.

Further, in a test operation, the semiconductor storage device having the above-described structure conducting the late-write operation has to be given a same write-command twice to surely write input data to the core circuit. A second write-command ensures writing the data corresponding to a first write-command to the core circuit. In this course, data corresponding to the second write-command is stored in the internal buffer, and, when another write-command is input, this data corresponding to the second write-command is written to the core circuit. As a result, the same data is written to the same memory cell.

When same data is written twice to the same memory cell in a test operation, an excess electric charge is applied also to an inferior memory cell that would normally be rejected as lacking a restoration. As a result, the memory cell is not detected out as an inferior cell lacking a restoration. This hinders effective rejection of inferior memory cells.

SUMMARY OF THE INVENTION

It is a general object of the present invention to provide an improved and useful semiconductor storage device in which device the above-mentioned problems are eliminated.

A more specific object of the present invention is to provide a semiconductor storage device which device can effectively detect an inferior memory cell in a test operation.

In order to achieve the above-mentioned objects, there is provided according to one aspect of the present invention a semiconductor storage device conducting a late-write operation, the device comprising:

a memory core circuit storing data;

a data latch circuit storing preceding data corresponding to a preceding write-operation;

an address compare circuit comparing a preceding address corresponding to the preceding write-operation and a present address corresponding to a present read-operation so as to determine whether the preceding address and the present address match each other; and a control circuit controlling a test read-operation to read data from the memory core circuit regardless of whether the preceding address and the present address match each other.

Additionally, in the semiconductor storage device according to the present invention, the control circuit controls a normal read-operation to read data from the memory core circuit when the preceding address and the present address do not match each other, and controls a normal read-operation to read the preceding data from the data latch circuit when the preceding address and the present address match each other.

Additionally, the semiconductor storage device according to the present invention further comprises:

a read-data amplifier amplifying data read from the memory core circuit; and a data input-output buffer outputting the data amplified by the read-data amplifier out of the semiconductor storage device, wherein the control circuit deactivating the read-data amplifier when the preceding address and the present address match each other in a normal read-operation, and activating the read-data amplifier regardless of whether the preceding address and the present address match each other in a test read-operation.

Additionally, in the semiconductor storage device according to the present invention, the control circuit controls the data latch circuit to output the preceding data when the preceding address and the present address match each other in a normal read-operation, and the control circuit controls the data latch circuit not to output the preceding data regardless of whether the preceding address and the present address match each other in a test read-operation.

In order to achieve the above-mentioned objects, there is also provided according to another aspect of the present invention a semiconductor storage device conducting a late-write operation, the device comprising:

an address compare circuit comparing a preceding address corresponding to a preceding write-operation and a present address corresponding to a present read-operation so as to determine whether the preceding address and the present address match each other; and a control circuit controlling a normal read-operation to read data from a memory core circuit when the preceding address and the present address do not match each other, controlling a normal read-operation to read data not from the memory core circuit but from a data latch circuit when the preceding address and the present address match each other, and controlling a test read-operation to read data from the memory core circuit regardless of whether the preceding address and the present address match each other.

According to the present invention, in a test operation, the semiconductor storage device can write data not to or read data not from an internal data buffer, but can write data to or read data from a memory cell aimed in the test. This enables confirming operations of a memory cell effectively and enables rejecting an inferior memory cell.

In order to achieve the above-mentioned objects, there is also provided according to another aspect of the present invention a semiconductor storage device having a function to mask one of higher order bits and lower order bits of all bits of data to be written in a normal write-operation, the device comprising:

a mask control circuit capable of masking all the bits of the data in a test write-operation.

Additionally, the semiconductor storage device according to the present invention conducts a late-write operation, the device further comprising:

a data latch circuit storing preceding data corresponding to a preceding write-operation;

a write-data amplifier amplifying the preceding data in a following write-operation; and a memory core circuit storing data amplified by the write-data amplifier, wherein the mask control circuit capable of masking all bits of data to be written to the memory core circuit.

Additionally, in the semiconductor storage device according to the present invention, the mask control circuit comprises:

a switch circuit coupling a mask control signal for masking higher order bits of the data and a mask control signal for masking lower order bits of the data so as to generate a mask control signal for masking all bits of the data;

a mask latch circuit storing the mask control signal for masking all bits in a first write-operation and outputting the mask control signal for masking all bits in a second write-operation; and a write-data amplifier activating circuit controlling activation of the write-data amplifier according to the mask control signal for masking all bits.

According to the semiconductor storage device of the present invention, all bits of data to be written to a memory core circuit can be masked in a second write-operation so as to avoid writing a same data to a same memory cell twice. Therefore, a memory cell that is to be rejected as lacking a restoration can surely be detected as an inferior cell. Thus, an inferior memory cell can be rejected effectively in a test of a semiconductor storage device.

Other objects, features and advantages of the present invention will become more apparent from the following detailed description when read in conjunction with the accompanying drawings.

BRIEF DESCRIPTION OF THE DRAWINGS

FIG. 4 is a circuit diagram of a mask switch circuit, a mask latch circuit and a write amplifier activating circuit shown in FIG. 1.

DETAILED DESCRIPTION OF THE PREFERRED EMBODIMENTS

A description will now be given, with reference to the drawings, of embodiments according to the present invention.

Figure 1:
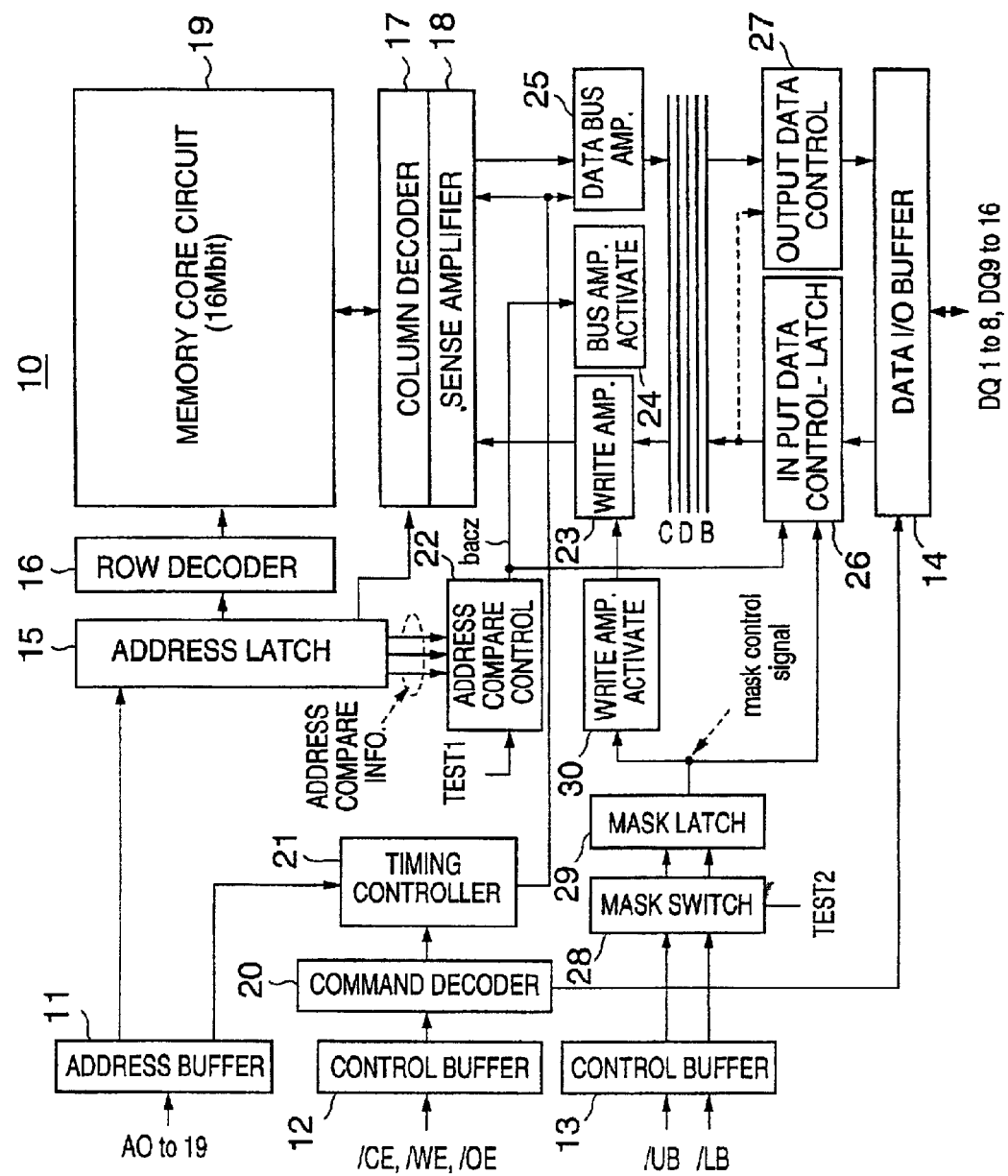
FIG. 1 shows a structure of a semiconductor storage device according to an embodiment of the present invention.

FIG. 1 shows a structure of a semiconductor storage device according to an embodiment of the present invention.

As shown in FIG. 1, a semiconductor storage device 10 comprises: an address buffer circuit 11; a control buffer circuit 12; a control buffer circuit 13; a data input-output buffer 14; an address latch circuit 15; a row decoder circuit 16; a column decoder circuit 17; a sense amplifier circuit 18; a memory core circuit 19; a command decoder circuit 20; a timing controller circuit 21; an address compare control circuit 22; a write amplifier 23; a bus amplifier activating circuit 24; a global data bus amplifier 25; an input data control-latch circuit 26; an output data control circuit 27; a mask switch circuit 28; a mask latch circuit 29; and a write amplifier activating circuit 30.

Control signals /CE, /WE and /OE are input into the control buffer circuit 12. The input control signals /CE, /WE and /OE are supplied from the control buffer circuit 12 to the command decoder circuit 20. The command decoder circuit 20 decodes these control signals /CE, /WE and /OE, and supplies the decoded result to the timing controller circuit 21. The timing controller circuit 21 controls operations of each element of the semiconductor storage device 10, based on the decoded result. It is noted that FIG. 1 shows only main control paths.

An address signal is input into the address buffer circuit 11. The input address signal is supplied from the address buffer circuit 11 to the address latch circuit 15. The address latch circuit 15 supplies a row address of the supplied address to the row decoder circuit 16, and a column address of the supplied address to the column decoder circuit 17.

The row decoder circuit 16 decodes the supplied row address and activates a word line corresponding to the row address. For example, in a data-read operation, when a word line corresponding to the row address is activated in the memory core circuit 19, data in a memory cell corresponding to the word line is read out to the sense amplifier circuit 18. The column decoder circuit 17 latches the column address supplied from the address latch circuit 15, and activates a column line corresponding to the column address. When the column line is activated, data corresponding to the column line in the sense amplifier circuit 18 is supplied to the global data bus amplifier 25 via a global data bus.

The global data bus amplifier 25 amplifies the data. The amplified data is supplied to the output data control circuit 27 via a chip data bus CDB. The data supplied to the output data control circuit 27 is read out of the semiconductor storage device 10 via the data input-output buffer 14.

In writing data, the semiconductor storage device 10 conducts a late-write operation, i.e., the semiconductor storage device 10 performs steps from inputting of data to writing of the data to a memory cell in the memory core circuit 19, not in one operation, but in two phases. First, in response to an initial write-command, data to be written is input into the data input-output buffer 14, and then is stored in the input data control-latch circuit 26 functioning as a data buffer. When a following write-command is input, the data stored in the input data control-latch circuit 26 is supplied to the write amplifier 23 via the chip data bus CDB, and is amplified in the write amplifier 23, and then is stored in a memory cell corresponding to a selected row address via the sense amplifier circuit 18 corresponding to a selected column address.

The address latch circuit 15 retains a preceding write address. In reading data, the preceding write address retained in the address latch circuit 15 is compared with a present read address, and then the comparison result is supplied to the address compare control circuit 22 as an address compare information.

In a normal operation, when the present read address matches the preceding write address, the address compare control circuit 22 changes a match signal bacz to a HIGH level. When the match signal bacz becomes HIGH, the bus amplifier activating circuit 24 deactivates the global data bus amplifier 25. Therefore, data read from the sense amplifier circuit 18 is not supplied to the chip data bus CDB. At the same time, by the match signal bacz being HIGH, the preceding write data latched by the input data control-latch circuit 26 is supplied to the output data control circuit 27 via the chip data bus CDB. Thereby, when the present read address matches the preceding write address, the preceding write data stored in the input data control-latch circuit 26 is read out of the semiconductor storage device 10 via the data input-output buffer 14.

When the present read address does not match the preceding write address, the match signal bacz is LOW. Therefore, the global data bus amplifier 25 is activated at a proper timing. Therefore, the input data control-latch circuit 26 does not output the preceding write data stored therein. Instead, as described above, data from the memory core circuit 19 is read out of the semiconductor storage device 10 via the global data bus amplifier 25.

In the present invention, when a test operation is specified, a test signal TEST1 input into the address compare control circuit 22 becomes LOW. This notifies the address compare control circuit 22 that the semiconductor storage device 10 is in a test operation. Thereby, the address compare control circuit 22 always keeps the match signal bacz LOW.

Therefore, in a test operation, whether the present read address matches the preceding write address or not, the global data bus amplifier 25 is activated at a proper timing. Therefore, the input data control-latch circuit 26 does not output the preceding write data stored therein. Instead, data from the memory core circuit 19 is read out of the semiconductor storage device 10 via the global data bus amplifier 25.

Next, a description will be given of operations of the address latch circuit 15 and the address compare control circuit 22.

Figure 2:
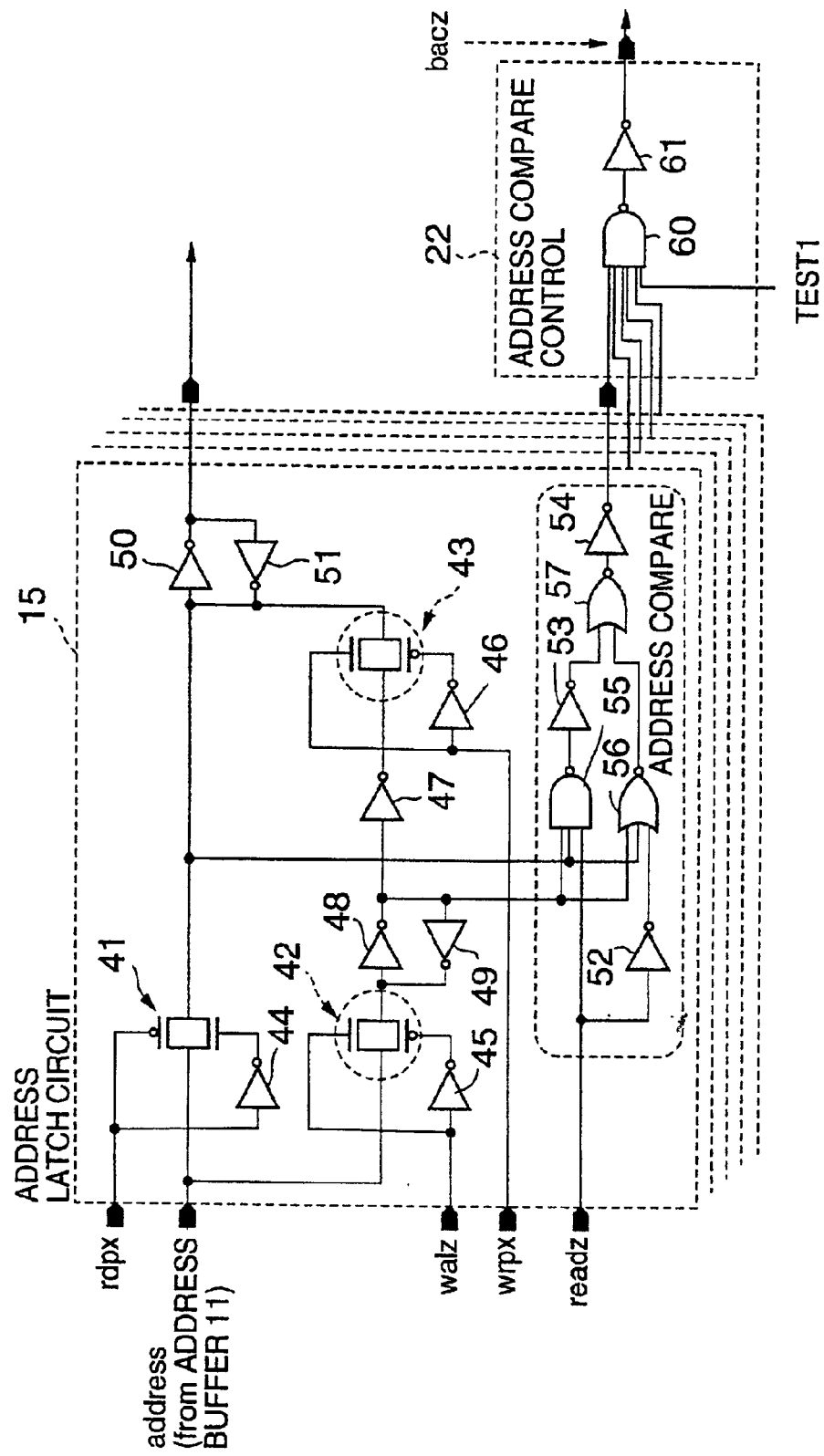
FIG. 2 is a circuit diagram of an address latch circuit and an address compare control circuit shown in FIG. 1.

FIG. 2 is a circuit diagram of the address latch circuit 15 and the address compare control circuit 22. FIG. 2 shows a structure of the address latch circuit 15 corresponding to one bit of the address signal.

As shown in FIG. 2, the address latch circuit 15 includes: gates 41 to 43 each comprising a PMOS transistor and an NMOS transistor; inverters 44 to 54; a NAND circuit 55; and NOR circuits 56 and 57. The inverters 48 and 49 compose a latch circuit. The inverters 50 and 51 compose another latch circuit. The inverters 52 to 54, the NAND circuit 55 and the NOR circuits 56 and 57 compose an address compare circuit that compares addresses.

A read-start pulse signal rdpx is input into the gate 41. A write-address latch signal walz is input into the gate 42. Further, a write-start pulse signal wrpx is input into the gate 43. These signals regarding timings of operations are supplied mainly from the timing controller circuit 21. It is noted that a signal tailed with "z" signifies a signal of a positive logic, and that a signal tailed with "x" signifies a signal of a negative logic.

In writing an address, the write-address latch signal walz becomes HIGH so that the gate 42 opens. Thereby, an address corresponding to a first write-command is supplied from the address buffer circuit 11, and then is stored in the latch circuit composed of the inverters 48 and 49. When a second address-write command is supplied, the write-start pulse signal wrpx (negative logic) becomes LOW, first. Thereby, the data stored in the latch circuit composed of the inverters 48 and 49 is stored in the latch circuit composed of the inverters 50 and 51 via the gate 43. This data is outputted from the address latch circuit 15, and is supplied to the row decoder circuit 16 or the column decoder circuit 17. The second address is stored in the latch circuit composed of the inverters 48 and 49 when the write-address latch signal walz becomes HIGH.

In this way, a preceding write-address (the second address in the above example) is always stored in the latch circuit composed of the inverters 48 and 49.

In an data-read operation, when the read-start pulse signal rdpx (negative logic) becomes LOW, an address supplied from the address buffer circuit 11 is through the date 41 to be stored in the latch circuit composed of the inverters 50 and 51. This data is outputted from the address latch circuit 15, and is supplied to the row decoder circuit 16 or the column decoder circuit 17.

Additionally, in a data-read operation, a read condition signal readz becomes HIGH so as to activate the address compare circuit. When the address compare circuit is activated, the address compare circuit compares a present read address signal supplied via the gate 41 and a preceding write address signal supplied via the latch circuit composed of the inverters 48 and 49. When the present read address signal and the preceding write address signal match each other, i.e., when bits of both address signals are either 1 or 0, the address compare circuit outputs a HIGH signal. This signal is supplied to the address compare control circuit 22.

The address compare control circuit 22 includes a NAND circuit 60 and an inverter 61. When all of the signals received by the address compare control circuit 22 are HIGH, i.e., when all bits of both address signals match each other, the address compare control circuit 22 makes its output signal, i.e., the match signal bacz, HIGH. This match signal bacz selects from which components of the semiconductor storage device 10 data is to be read out in a data-read operation, as described in conjunction with FIG. 1.

Figure 3:
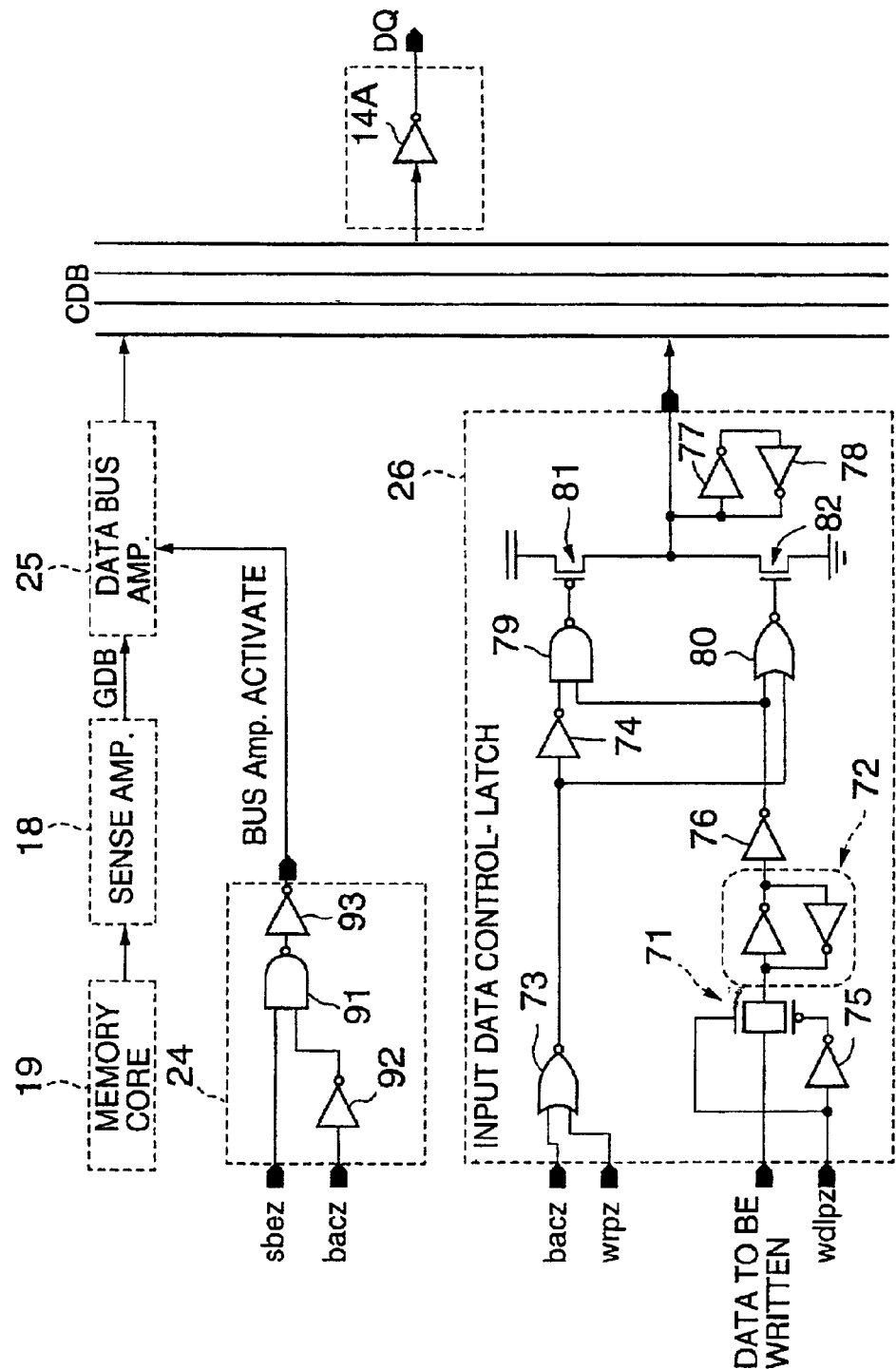
FIG. 3 is an illustration for explaining operations of reading data in a data-read operation of the semiconductor storage device shown in FIG. 1.

FIG. 3 is an illustration for explaining operations of reading data in a data-read operation. FIG. 3 shows a structure of the input data control-latch circuit 26 corresponding to one bit of data.

As shown in FIG. 3, the input data control-latch circuit 26 includes: a gate 71 composed of a PMOS transistor and an NMOS transistor; a latch circuit 72 composed of two inverters; inverters 74 and 75–78, a NAND circuit 79; NOR circuits 73 and 80; a PMOS transistor 81; and an NMOS transistor 82. The bus amplifier activating circuit 24 includes a NAND circuit 91 and inverters 92 and 93.

In writing data, when a write-data latch pulse signal wdlpz from the timing controller circuit 21 becomes HIGH, the date 71 opens, and then data to be written supplied from the data input-output buffer 14 is stored in the latch circuit 72. When a next write-command makes a write-start pulse signal wrpz HIGH, the data stored in the latch circuit 72 emerges as an output from a circuit composed of the PMOS transistor 81 and the NMOS transistor 82, and is stored in a latch circuit composed of the inverters 77 and 78, and is also output from the input data control-latch circuit 26. In a data-write operation, the match signal bacz is LOW.

In a data-read operation, when a present read address does not match a preceding write address, the match signal bacz is LOW. Therefore, the PMOS transistor 81 and the NMOS transistor 82 are off, with the output being neither HIGH nor LOW, i.e., in a suspended state. At this time, since the match signal bacz is LOW in the bus amplifier activating circuit 24, a bus amplifier activating signal shez is supplied to the global data bus amplifier 25 so as to activate the global data bus amplifier 25. Accordingly, when the present read address does not match the preceding write address, data read from the memory core circuit 19 is supplied to the chip data bus CDB via the sense amplifier circuit 18 and the global data bus amplifier 25, and is further read out of the semiconductor storage device 10 via an output buffer 14A of the data input-output buffer 14.

When a present read address matches a preceding write address, the match signal bacz is HIGH. Therefore, an output of the circuit composed of the PMOS transistor 81 and the NMOS transistor 82 in the input data control-latch circuit 26 is the preceding write data. At this time, since the match signal bacz is HIGH in the bus amplifier activating circuit 24, an output of the inverter 93 is always LOW. Thereby, the global data bus amplifier 25 is deactivated. Accordingly, when the present read address matches the preceding write address, the global data bus amplifier 25 is deactivated, and the input data control-latch circuit 26 outputs the preceding write data to the chip data bus CDB, whereby the preceding write data is read out of the semiconductor storage device 10 via an output buffer 14A of the data input-output buffer 14.

In a test operation, the match signal bacz is always LOW. Therefore, whether a present read address matches a preceding write address or not, the PMOS transistor 81 and the NMOS transistor 82 in the input data control-latch circuit 26 are off, with the output being neither HIGH nor LOW. Further, the bus amplifier activating circuit 24 activates the global data bus amplifier 25. Accordingly, in a test operation, data read from the memory core circuit 19 is supplied to the chip data bus CDB via the sense amplifier circuit 18 and the global data bus amplifier 25, and is further read out of the semiconductor storage device 10 via an output buffer 14A of the data input-output buffer 14.

In this way, in a test operation, whether a present read address matches a preceding write address or not, data can be read from a memory cell corresponding to the present read address.

Next, a description will be given of a structure for avoiding an operation of writing same data twice in a memory cell.

As described above, in a semiconductor storage device which conducts a late-write operation, a same write-command has to be given twice to surely write input data to a core circuit in a test operation. However, if same data is written twice to a same memory cell in a test operation, an excess electric charge is charged to a memory cell that would normally be rejected as lacking a restoration. As a result, the memory cell is not detected out as an inferior cell lacking a restorations.

In FIG. 1, the semiconductor storage device 10 according to the present invention has a function to mask higher order bits of input data and a function to mask lower order bits of input data as the same interface as a conventional SRAM. In order to mask the higher order bits, a control signal /UB is input into the control buffer circuit 13. In order to mask the lower order bits, a control signal /LB is input into the control buffer circuit 13. Accordingly, when data is written for the second time, masking the data by using these mask functions can avoid writing the data for the second time.

It should be noted here that, since the same interface as a conventional SRAM can only mask either the higher order bits or the lower order bits, a structure capable of masking all the bits needs to be provided.

In the semiconductor storage device 10 according to the present invention, in a test operation, a test signal TEST2 couples the control signal /UB for masking higher order bits and the control signal /LB for masking lower order bits in the mask switch circuit 28 so as to generate a mask control signal for masking all bits. This mask control signal for masking all bits is latched in the mask latch circuit 29. The mask control signal for masking all bits is supplied from the mask latch circuit 29 to the write amplifier activating circuit 30 so as to control the write amplifier activating circuit 30 to deactivate the write amplifier 23. Thus, using the mask control signal for masking all bits can mask data from being written to the memory core circuit 19. Thereby, the semiconductor storage device 10 according to the present invention can prevent the second writing operation of two writing operations.

FIG. 4 is a circuit diagram of the mask switch circuit 28, the mask latch circuit 29 and the write amplifier activating circuit 30. The mask switch circuit 28, the mask latch circuit 29 and the write amplifier activating circuit 30 together form a mask control circuit.

As shown in FIG. 4, the mask switch circuit 28 includes: a gate 101 comprising an NMOS transistor and a PMOS transistor; and an inverter 102. The mask latch circuit 29 includes: gates 111 and 112 each comprising an NMOS transistor and a PMOS transistor; latch circuits 115 and 116 composed of two inverters; and inverters 113 and 114. The write amplifier activating circuit 30 includes: an inverter 121; a NAND circuit 122; and an inverter 123.

When the test signal TEST2 is input into the mask switch circuit 28, the gate 101 opens so that the control signal /UB for masking higher order bits and the control signal /LB for masking lower order bits are coupled into the mask control signal for masking all bits. When the write-address latch signal walz supplied to the mask latch circuit 29 becomes HIGH in response to the first write-command, the mask control signal for masking all bits is stored in the latch circuit 115. When the write-start pulse signal wrpx supplied to the mask latch circuit 29 becomes LOW in response to the second write-command, the mask control signal stored in the latch circuit 115 is stored in the latch circuit 116.

The mask control signal for masking all bits stored in the latch circuit 116 is supplied from the mask latch circuit 29 to the write amplifier activating circuit 30. This mask control signal is of a positive logic, thus becomes HIGH so as to mask. Accordingly, an output of the inverter 121 becomes LOW so that a write amplifier activating signal wepz supplied to the write amplifier activating circuit 30 is not supplied from the write amplifier activating circuit 30 to the write amplifier 23. Therefore, the write amplifier 23 is deactivated so that data is not written to the memory core circuit 19 shown in FIG. 1 in the second writing operation.

It is noted that, when the test signal TEST2 is not supplied to the mask switch circuit 28, a data mask control is the same as the data mask control of a conventional SRAM, and thus is in the scope of a conventional technology. A description concerning functions and circuit structures of such conventional SRAM is omitted here.

Additionally, when both of the control signal /UB (negative logic) for masking higher order bits and the control signal /LB (negative logic) for masking lower order bits are LOW, the mask control signal (positive logic) supplied from the mask latch circuit 29 to the write amplifier activating circuit 30 becomes LOW even in a test operation. Therefore, in this case, the write amplifier activating signal wepz is supplied from the write amplifier activating circuit 30 to the write amplifier 23 so that data is written to the memory core circuit 19 shown in FIG. 1.

As described above, the semiconductor storage device 10 according to the present invention has the function to mask higher order bits of input data and the function to mask lower order bits of input data as the same interface as a conventional SRAM, and further couples the control signal for masking higher order bits and the control signal for masking lower order bits so as to generate the mask control signal for masking all bits. Using this mask control signal for masking all bits can mask data from being written to the memory core circuit 19, and thus can avoid writing a same data to a same memory cell twice.

The present invention is not limited to the specifically disclosed embodiments, and variations and modifications may be made without departing from the scope of the present invention.

The present application is based on Japanese priority application No.2000-047804 filed on Feb. 24, 2000, the entire contents of which are hereby incorporated by reference.

What is claimed is:

1. A memory device receiving a plurality of bits of write data, comprising:

a first data mask terminal receiving an upper bit mask signal for masking upper bits of said write data;

a second data mask terminal receiving a lower bit mask signal for masking lower bits of said write data; and a mask control circuit for outputting a mask control signal, by coupling said upper and lower bit mask signals, to mask all bits of said write data in a test write operation.

2. The memory device as claim in claim 1, wherein the mask control circuit outputs the mask control signal in response to the upper bit mask signal or the lower bit mask signal to mask either the upper bits or the lower bits of said write data in a normal write operation.

3. The memory device as claimed in claim 1, wherein said mask control circuit includes a mask switch circuit receiving the upper and lower bit mask signals for coupling the upper and lower bit mask signals in response to a test signal to produce the mask control signal.

4. The memory device as claimed in claim 1, further comprising a write-off amplifier receiving the write data for amplifying and transferring the write data to a memory core circuit, wherein the mask control signal controls an operation of the write-data amplifier.

5. The memory device as claim in claim 1, wherein the memory device conducts a late write operation.

6. The memory device as claimed in claim 5, wherein, in the late write operation, first write data corresponding to a first write command is written in a memory core circuit upon a receipt of subsequent second write command.

7. The memory device as claimed in claim 6, wherein, in a test write operation, all bits of second write data corresponding to the second write command are not written in the memory core circuit in response to the mask control signal.

* * * * *